United States Patent [19]
Fensch

[11] Patent Number: 4,988,900
[45] Date of Patent: Jan. 29, 1991

[54] ANALOG SIGNAL WAVEFORM GENERATOR

[75] Inventor: Thierry Fensch, Grenoble, France

[73] Assignee: SGS-Thomson Microelectronics S.A., Gentilly, France

[21] Appl. No.: 456,644

[22] Filed: Dec. 27, 1989

[30] Foreign Application Priority Data

Dec. 28, 1988 [FR] France ............... 88 17577

[51] Int. Cl.⁵ ............... H03M 1/66; H03K 5/22; H03K 17/56
[52] U.S. Cl. .................. 307/494; 307/246; 307/260; 328/142; 341/150
[58] Field of Search ............ 307/260, 261, 491, 494, 307/500, 246; 328/28, 127, 142; 341/144, 147, 160, 150

[56] References Cited

U.S. PATENT DOCUMENTS

| | | | |
|---|---|---|---|
| 4,211,981 | 7/1980 | Lerma ................... | 307/491 |
| 4,438,354 | 3/1984 | Haque et al. ............ | 307/491 |
| 4,446,438 | 5/1984 | Chang et al. ............ | 307/491 |
| 4,578,646 | 3/1986 | Maio et al. ............. | 307/491 |
| 4,584,568 | 4/1986 | Zomorrodi .............. | 341/150 |
| 4,616,185 | 6/1984 | Van Roermund ......... | 307/529 |
| 4,617,481 | 10/1986 | Masuda ................. | 307/491 |
| 4,661,802 | 4/1987 | Yukawa ................. | 341/150 |
| 4,667,179 | 5/1987 | Law et al. .............. | 341/150 |
| 4,695,804 | 7/1985 | Bardl et al. ............ | 307/529 |
| 4,707,624 | 11/1987 | Yee .................... | 307/491 |
| 4,714,843 | 12/1987 | Smith .................. | 307/491 |
| 4,853,698 | 8/1989 | Roessler ............... | 341/150 |

FOREIGN PATENT DOCUMENTS 0132885  7/1984  European Pat. Off.
0171678  7/1985  European Pat. Off.
0228941  12/1986  European Pat. Off.
61-261949  11/1986  Japan.

OTHER PUBLICATIONS

Cox, Douglas B., "A Digitally Programmable Switched-Capacitor Universal Active Filter/Oscillator," *IEEE Journal of Solid-State Circuits*, vol. SC-18, No. 4, 1983, pp. 383-389.

Primary Examiner—Stanley D. Miller
Assistant Examiner—Toan Tran
Attorney, Agent, or Firm—Lowe, Price, LeBlanc, Becker & Shur

[57] ABSTRACT

A generator capable of forming an analog signal having a waveform determined from a sequence of digital control words applied at a high frequency, each word representing an increment of the analog signal to be produced at the output. For this type of generator, the accuracy of the increment value is an essential parameter. If several increments having a different value are generated as a function of the control word, their ratio has to be very accurate. The diclosed circuit is of the switched-capacitor type; it comprises several input capacitors (C1, C2, C3) that are theoretically identical. In order to take into account the dispersion due to manufacturing, a procedure for choosing the best input capacitor is previously established for obtaining a precise ratio between the increments ($+V$, $+3V$, $-V$, $-3V$) that can be supplied at the output. This procedure consists in comparing capacitors by pairs to sequence them and select the median capacitor. Comparison is carried out by using the main amplifier of the switched-capacitor circuit.

5 Claims, 4 Drawing Sheets phase a phase b

ANALOG SIGNAL WAVEFORM GENERATOR

BACKGROUND OF THE INVENTION

The present invention relates to a waveform generator for an analog electric signal.

The aim of such a device is to produce an analog electric signal having a well determined shape from digital information applied in the form of digital word sequences, each word representing an increment of the analog signal.

In an exemplary embodiment, each of the words may comprise three bits, so that there are at the most six possible increment values for the analog signal. The generator periodically receives a 3-bit word, and the output signal is incremented by a value which depends upon the word value.

Before describing the general structure of the generator, an exemplary embodiment will be disclosed to show the requirements that are to be met for realizing the generator.

The chosen example relates to a telecommunication circuit comprising a telephone line which has to emit sinusoid portions having a determined frequency.

The sinusoid portions are determined in the form of a series of digital words representing the positive or negative increments that are to be constantly added to the signal so that this signal actually represents a sinusoid portion.

Digital words comprising only one bit representing an increment sign could be envisaged: $+V$ or $-V$ increment; but then the maximum output slope of the analog signal is limited since form one sampling period to the next one it is not possible to increase the analog signal by more than one increment. Indeed, this increment necessarily has a relatively low value with respect to the overall amplitude of the analog signal, if it is desired to realize low slopes for the output signal without being compelled to provide for the possibility of generating null increments (which is not desirable for transmission mode reasons).

That is the reason why it is chosen to define the analog signal by increments having several possible amplitudes; in the example chosen for illustrating the problem, the digital words have 3 bits permitting to determine 5 possible values, which are: 1 null central value, 2 positive values and 2 negative values, the absolute values of which are equal to the positive values.

However, still in the same example, it has been provided that the positive values are in a ratio equal to 3.

In other words, if V is the increment value of the elementary analog signal, the 5 possible increment values are:

$$-3V, -V, 0, V, 3V$$

It will be noted later on that this ratio 3 plays an essential role (however, the ratio could be different, for example equal to 4 or 5).

The digital words can be applied to a very high input frequency, the output analog signal exhibiting the form of a step signal wherein the sampling period is substantially higher than twice the maximum frequency of the analog signal spectrum to be produced; in this way, there is no problem in smoothing the signal through a non-sampled low-pass filter, positioned at the generator output.

Typically, the sampling frequency can be 15 MHz for an analog signal, the spectrum of which is limited to 80 KHz.

The principle of restoring an analog signal by a series of digital words representing a very low number of possible increments is therefore very advantageous since it limits the complexity of the digital/analog conversion circuits (it is easier to process 3 bits at high frequency that 12 bits) and it facilitates the smoothing filter realization at the output (this filter is different to form when the sampling frequency is too close to twice the maximum frequency of the analog signal to be produced).

However, in order for the waveform generator to operate satisfactorily, it is then necessary that the value of the increments be accurately determined, failing which the signal produced is not the signal that is expected. This is easily understood since an integration of successive increments is carried out: a small difference in one increment may, if it is often repeated, lead to a very important trouble in the shape of the produced signal.

One of the objects of the invention is to provide for an analog signal waveform generator that supplies signal increments as accurate as possible and, in particular, increments that are in close relative ratio the one with respect to the other when several increment values are liable to be generated as a function of the input digital word.

BRIEF DESCRIPTION OF THE INVENTION

The waveform generator according to the invention, designed to produce an analog signal from a sequence of digital control words, wherein each word represents an increment of the analog signal, is constituted in the form of a switched-capacitor circuit comprising a differential amplifier having at least one input and a least one output, with a non-switched integration capacitor between the output and the input, a loop switched-capacitor between the input and the output, and several input switched-capacitors having identical nominal value that can be alternatively switched between a reference voltage and the amplifier input, either individually or in parallel one with respect to the other as a function of the applied digital word. The generator comprises means for establishing, before an analog signal formation sequence, a comparison phase of the input capacitors one with respect to the other for determining the input capacitor having the closest value to the average input capacitor values, and means for imposing the use of this capacitor during a subsequent analog signal formation sequence when the digital control word imposes switching of an individual capacitor between the reference voltage and the amplifier input.

The object of this preliminary comparison phase is to determine the most suitable capacitor to be chosen among the various individual input capacitors so as to have the analog signal increment as close as possible to 3V when all the input capacitors are in parallel, the increment being V when the selected capacitor is switched (in case the two possible increment values are V and 3V, but it will be understood that the problem is the same if the values are different).

This arrangement takes into account, in the most efficient possible way, the dispersion that is liable to exist between the values of the capacitors, even if the greatest care was taken during the manufacturing stage in order to have individual capacitors as identical as possible.

Indeed, it is desired that the ratio between the analog signal increments be precise to within 1 per thousand whereas there may be a dispersion of 3 per thousand at the manufacturing stage. The invention makes it possible to obtain this improvement.

According to the invention, the differential amplifier itself is preferably used as a charge comparator during the comparison phase of the capacitor values.

Reference voltages of identical values are applied to a first set of two input capacitors, then both input capacitors are parallel connected to the amplifier input, by connecting them in such a direction that the charges of the two capacitors are counterbalanced, the amplifier being set in an open loop mode and its output being triggered in a direction depending upon the sign of the difference between the values of the two capacitors. These operations are repeated for all the input capacitors taken by pair, and a bit corresponding to the triggering direction of the amplifier is each time stored in a register. A decoder receives the bits stored in the register and supplies information on the median capacitor of the sequence of capacitors classified in ascending order. It is this capacitor that will be used and not the others when a single input capacitor will have to be switched for forming the analog signal.

Preferably, the differential amplifier has two differential inputs and two differential outputs, and the assembly of the switched-capacitor circuit symmetrically surrounds the amplifier. Preferably as well, during the comparison phase of the input capacitors, an offset-compensating comparison mode will be used for the input offset voltage(s) of the amplifier; "offset voltage" is to be construed, as is conventional, as the difference in voltage present between an input and a common-mode voltage when the output and input are interconnected.

BRIEF DESCRIPTION OF THE DRAWINGS

The foregoing and other objects, features and advantages of the invention will be apparent from the following detailed description of preferred embodiments as illustrated in the accompanying drawings wherein.

DETAILED DESCRIPTION OF THE INVENTION

Figure 1:
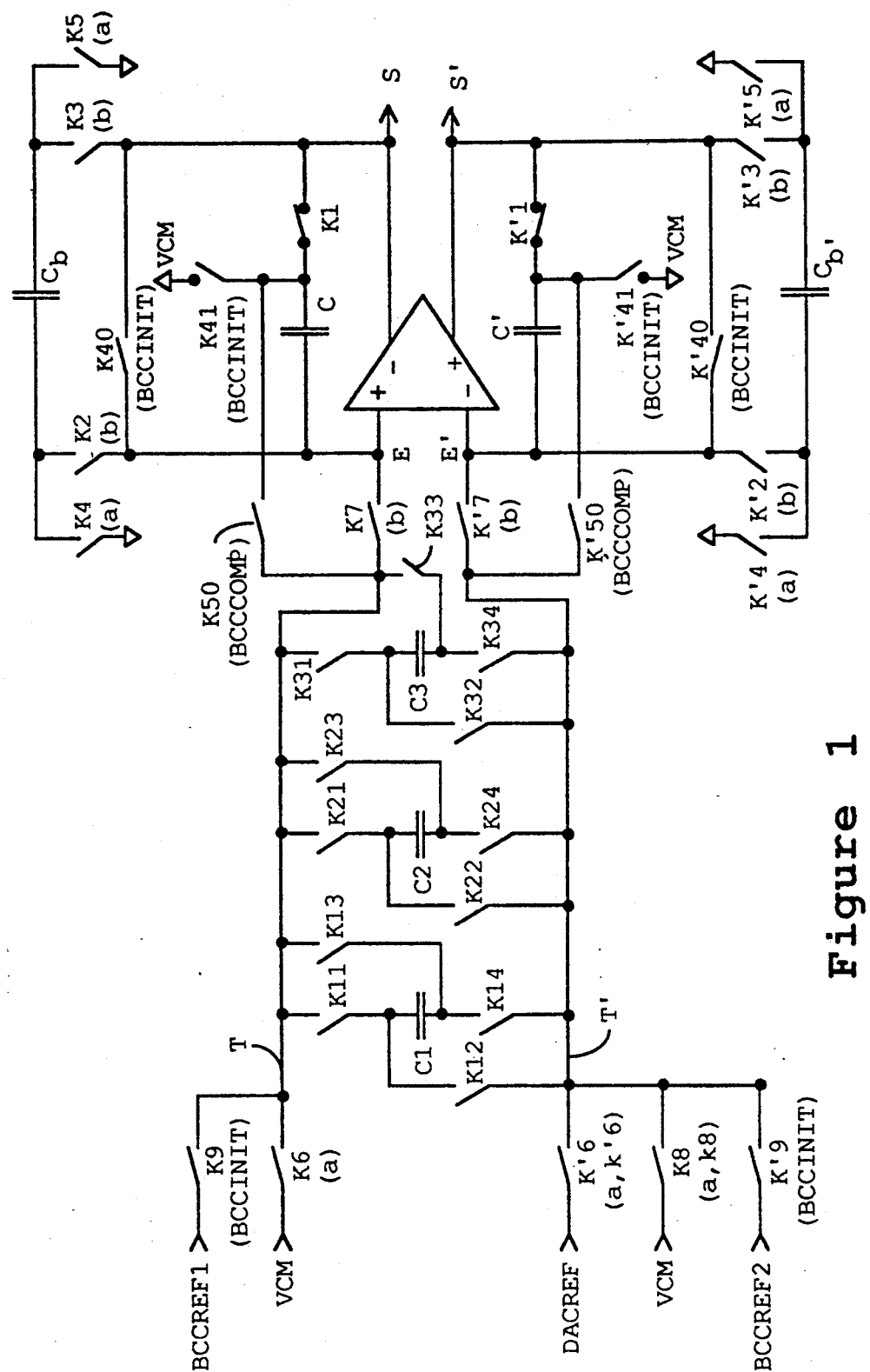
FIG. 1 shows a block diagram of the switchedcapacitor circuit forming the core of the generator according to the invention.

The circuit of FIG. 1 is a switched-capacitor circuit capable of carrying out a digital/analog conversion function. It is liable to receive a sequence of 3-bit digital control words, applied at a clock frequency F. A clock (not shows) determines the switching cycles of the various switches of FIG. 1 so that the digital control words may successively occur at the frequency F.

Frequency F is for example 15 MHz.

Applying a control word generates a voltage increment at the circuit output and this increment has a value that depends upon the control word.

In the specific example described here, the following conversion code has been chose, wherein a0, a1, a2 represent the three bits of the control word and V an elementary increment value. The possible positive or negative increments are O, V or 3V.

| a0 | a1 | a2 | increment |
|----|----|----|-----------|
| 1  | 1  | 1  | +3 V      |
| 1  | 0  | 1  | +V        |
| 1  | 0  | 0  | 0         |
| 0  | 1  | 1  | 0         |
| 0  | 1  | 0  | −V        |
| 0  | 0  | 0  | −3 V      |

Increment O is actually used only for checking purpose and not for conversion phases.

Generating an increment +V consists in transferring a charge CV into an integration capacitor, this charge being added to the already existing charge. Generating an increment −V consists in transferring the same charge by subtraction. Generating an increment 3 V or −3 V consists in transferring a charge three times as high as the preceding one, by addition or subtraction, respectively.

The circuit shown in FIG. 1 is a symmetric differential circuit, constructed around a differential amplifier having two symmetric inputs and two symmetric outputs. But a non-symmetric arrangement could be devised.

The amplifier comprises an input E and an input E', an output S and an output S'. Output S supplies a signal varying in reverse direction with respect to input E, and similarly output S' supplies a signal varying in reverse direction with respect to E'.

Output S is connected to input E through an integration capacitor C and similarly S' and E' are connected through another integration capacitor C' having the same value as C. Those capacitors are not switched-capacitors, that is, they remain connected between the input and the output during the whole time duration of the analog signal formation sequence. However, a switch K1 and a switch K'1 can be seen in FIG. 1; they permit disconnecting of capacitor C and capacitor C' from output S and output S', respectively. Those switches are switched off only during the preliminary phase BCC (best input capacitor choice procedure). They are switched on the remainder of time, that is, during a phase BCC* complementary to phase BCC.

The circuit further comprises two identical feedback switched-capacitors, Cb and Cb', respectively, liable to be either connected, one in parallel with the integration capacitor C and the other in parallel with C', or connected by their two terminals to the ground or to a common-mode voltage VCM.

The feedback capacitors have a substantially lower value than the integration capacitors, for example 1 picofarad for Cb and 13 picofarads for C.

Those capacitors are switched at a high frequency during the analog signal formation, four switches K2, K3, K4, K5 for capacitor Cb and another four switches K'2, K'3, K'4, K'5 for capacitor Cb' permitting the switching.

The other switched-capacitors of the circuit are input capacitors. Three of them C1, C2, C3 appear in the described circuit.

For those capacitors, the high frequency switching alternatively connects them to reference voltages and then to the differential amplifier inputs.

However, the switches permitting this switching are numerous in order to permit that a single individual capacitor C1 or C2 or C3 be switched (charge through a reference voltage and then connection to the amplifier input) or otherwise that the three input capacitors C1, C2, C3 be switched in parallel. Moreover, the number of switches is multiplied by two for allowing the connection at the amplifier inputs to be carried out either directly in the direction the capacitors have been charge or in the reverse direction by crossing the connections.

Thus, capacitor C1 is associated with four switches K11, K12, K13, K14 permitting to connect each of its terminals to either of the two conductors T and T'; conductors T and T' can be connected to reference voltages or to inputs E and E' of the differential amplifier through other switches.

More specifically, during the first phase (phase a) of each clock cycle (a cycle corresponding to the application of a new digital incrementation control word), an input switched-capacitor C1 or C2 or C3 (if the control word corresponds to an incrementation +V or −V) or the three capacitors at a time (if the control word corresponds to an incrementation +3V or −3V) is connected between a reference common-mode voltage VCM and a reference voltage DACREF (Digital-/Analog Conversion REFerence voltage).

For this purpose, a switch K6 connects conductor T to voltage VCM and a switch K'6 connects conductor T' to voltage DACREF. Switches K6 and K'6 are switched on during the first phase (phase a) of each clock cycle. They are switched off during the second phase (phase b). In FIG. 1, is shown in brackets near each switch the phase during which said switch is switched on.

The connection of one or three capacitor(s) at a time is determined by switches K11-K34, as well as the connection direction for imposing the capacitor charge direction or the subsequent transfer direction of this charge.

During phase a, capacitors Cb and Cb' are discharged by the switching on of switches K4 and K5, K'4 and K'5 which connect them to the common-mode voltage, switches K2, K3, K'2, K'3 being then switched off.

Capacitors C1, C2, C3 are theoretically identical and their nominal value is preferably equal to half the common nominal value of the feedback switched-capacitors Cb and Cb'.

During the second phase (phase b) of each clock cycle, the input capacitors(s) that had been previously charged are disconnected from voltage sources VCM and DACREF (switching off of switches K6 and K'6) and are connected to the amplifier inputs E and E' while the discharged loop capacitors Cb and Cb' are connected again in parallel on the respective integration capacitors C and C'.

The charge stored in the input capacitor(s) is then transferred into the integration capacitor and loop capacitor, and it generates a differential voltage increment. The increment is positive or negative depending upon the connection direction of the input capacitors; its amplitude is V or 3 V depending on whether one or three capacitor(s) in parallel are used during the cycle.

For connecting the input capacitors to inputs E and E' during phase b, a switch K7 is provided for between conductor T and input E and a switch K'7 between conductor T' and input E'.

Figure 2:
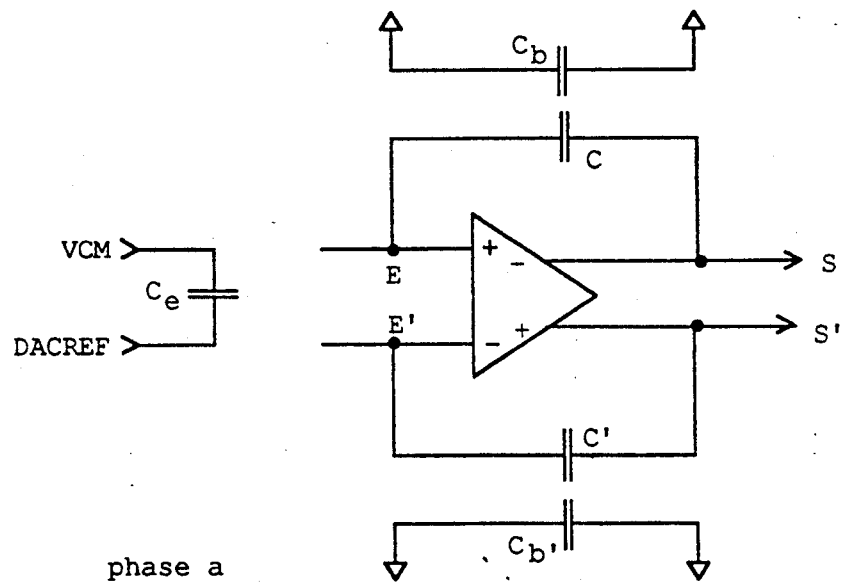
FIG. 2 shows the circuit configuration during the first step of generating an analog signal increment during the waveform formation sequence.
Figure 3:
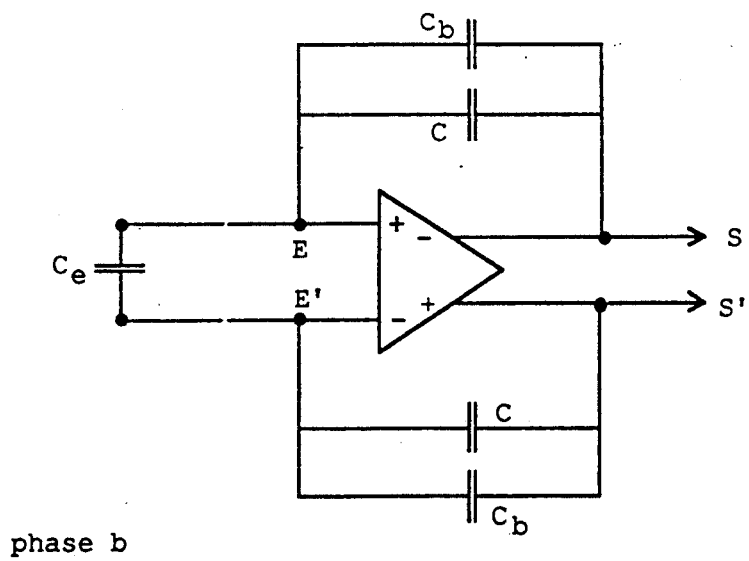
FIG. 3 shows the circuit configuration during the second step of generating an analog signal increment during the waveform formation sequence.

To summarize phase a, FIG. 2 shows the general circuit configuration during said phase; the input capacitor Ce is one of capacitors C1, C2 or C3 (for obtaining an increment with an amplitude V) or the three capacitors in parallel (for obtaining an increment with an amplitude 3V). Phase b is shown in FIG. 3; capacitor Ce is the same as in FIG. 2 but its connection direction depends upon the sign it si desired to obtain for the increment.

In FIG. 1, it can be noted that there is a switch K8 permitting to connect conductor T' to the common-mode voltage VCM, for checking purpose only, the output increment being therefore null.

Now will be described the circuit components permitting to establish, prior to the phases of formation of a desired analog waveform, a sequence BCC for choosing among capacitors C1, C2, C3 the most suitable capacitor for obtaining the highest possible ratio accuracy between increment V and increment 3V theoretically expected.

The selection sequence is carried out in several steps and each step comprises two phases called BCCINIT (initialization) and BCCCOMP (comparison per se). The various steps correspond to comparisons by pair of different input capacitors; for example, first capacitors C1 and C2, then C2 and C3 and then C3 and C1.

During the initialization phase BCCINIT, a switch K40 is switched on, shorting input E and output S, together with a switch K'40 shorting input E' and output S'; simultaneously, switches K1 and K'1 are switched off so that a terminal of capacitor C and capacitor C', previously con-nected to output S and S', respectively, is disconnected; this terminal is then connected to the common-mode voltage VCM through a switch K41 for capacitor C and K'41 for capacitor C'.

On the other hand, still during the initialization phase BCCINIT, two switches K9 and K9' are switched on, connecting conductor T and conductor T', respectively, to a first reference voltage BCCREF1 and to a second reference voltage BCCREF2.

Lastly, four among the switches K11-K34 are switched on for connecting two input capacitors chosen between BCCREF1 and BCCREF2. For example, the capacitors chosen during the operating steps are C1 and C2 and the switches that are switched on are K11, K14, K21, K24; the others are switched off.

Two simultaneous different operations are then carried out during the initialization phase; the first one memorizes the amplifier offset voltages in the integration capacitors C and C' each of which is connected between an amplifier input and the common-mode voltage VCM, the amplifier being looped at a unit gain by shorting input E and output S, on the one hand, and shorting input E' and output S', on the other hand; the second operation charges the two capacitors to be compared with a common reference voltage equal to BCCREF1 - BCCREF2.

Figure 4:
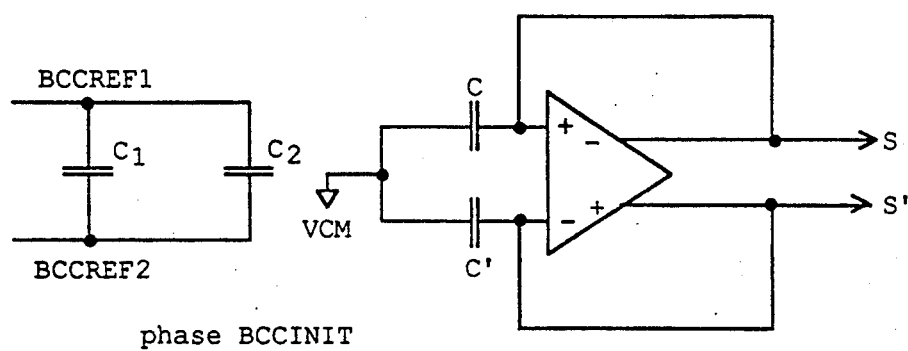
FIG. 4 shows the circuit configuration during an initialization phase of the best capacitor choice procedure.

FIG. 4 shows the circuit configuration of FIG. 1 during the initialization phase BCCINIT of a comparison step of two input capacitors. It is assumed here that the capacitors that are compared during this step are capacitors C1 and C2; the following steps serve to compare the other groups of capacitors: C2 with C3, then C3 with C1.

The next phase is the effective comparison phase of the input capacitors. This phase BCCCOMP consists in using the differential amplifier as a comparator triggering in either direction according to the voltage applied between its inputs; this voltage is the residual voltage present across the terminals of capacitors C1 and C2 to be compared when the latter are parallel connected in such a direction that their charges tend to be counterbalanced.

In other words, if C1 and C2 have been charged in parallel under a voltage BCCREF1-BCCREF2 during the BCCINIT phase, C1 and C2 are again parallel connected but their connections are crossed during the BCCCOMP phase for allowing the charges to be counterbalanced; if C1 and C2 are strictly identical, the charges are strictly counter-balanced and the voltage across terminals C1 and C2 becomes null; if there is a slight difference in the value, a residual charge will subsist and a residual voltage will appear across the terminals of capacitors C1 and C2. This residual voltage, applied between the differential amplifier inputs, will cause the differential amplifier to switch its output state in either direction, supplying an indication on the relative values of the input capacitors that are being compared. Switches K40, K41, K'40, K'41 are switched off during this phase BCCCOMP for allowing the amplifier to be set in open loop.

The amplifier output signal is stored in a register, not shown in FIG. 1.

In order to take into account the existence of the amplifier offset voltages, the application of the residual voltage is carried out through the integration capacitors that have been previously charged during the initialization phase by the offset voltages.

That is the reason why FIG. 1 represents a switch K50 permitting to connect during phase BCCCOMP conductor T to the terminal of integration capacitor C that was connected to VCM during the initialization phase BCCINIT.

Similarly, a switch K'50 permits to connect capacitor C' to conductor T'.

Figure 5:
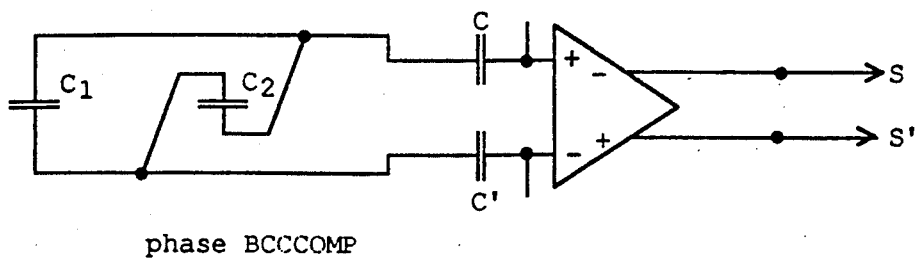
FIG. 5 shows the circuit configuration during a comparison phase itself of two input capacitors.

The circuit configuration during the comparison phase itself BCCCOMP is shown in FIG. 5.

Switches K11-K24 permit to cross the connections of capacitors C1 and C2; consequently, if switches K11, K14, K21, K24 were switched on during phase BCCINIT, then K11, K14, K22, K23 are switched on during phase BCCCOMP, the others being switched off.

After storing in a register a bit indicating which one of capacitors C1 and C2 has the highest value, the operation is repeated for another capacitor group, C2, C3 then for the last one, C3, C1, and the corresponding bits are stored in the register. Decoding of the register content (three bits if three comparisons are carried out) permits to classify the capacitors into ascending or descending order and to select the median capacitor of the sequence. This capacitor will be used in the subsequent phases for forming an analog signal in order to have the greatest possible ratio accuracy between the real values of the theoretical increments V and 3V or $-V$ and $-3V$.

Figure 6:
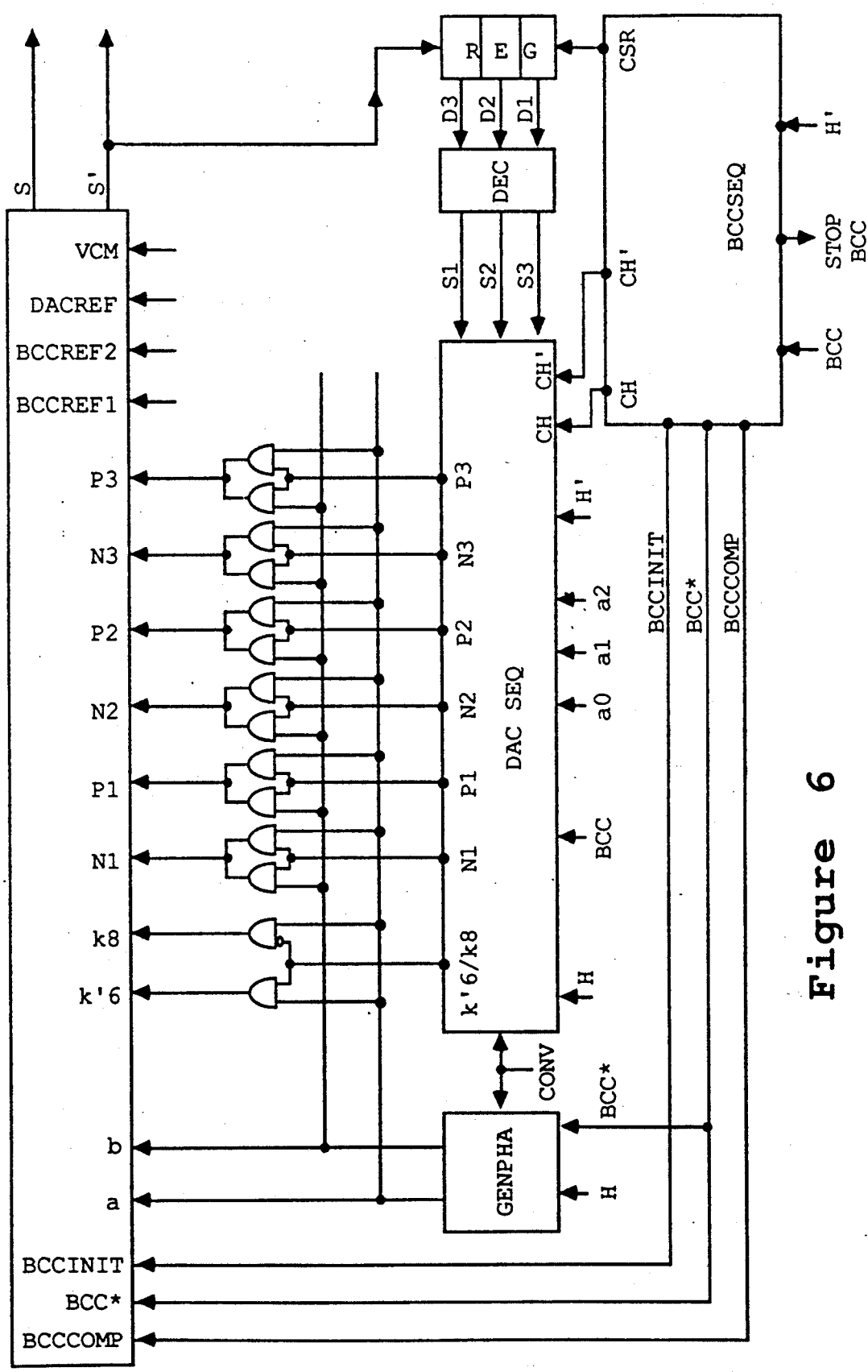
FIG. 6 is a block diagram of the waveform generator according to the invention.

The overall circuit according to the invention is shown in FIG. 6 in the form of a block diagram showing different components necessary for the operation of the various phases described hereinabove.

The switched-capacitor circuit of FIG. 1 is repeated in the form of a block SCF having a given number of supply and control terminals, already described, and the two outputs S and S' supplying the desired analog signal (in differential mode).

The control terminals are;

BCCCOMP: for receiving a signal BCCCOMP indicating the actual comparison phase of the input capacitors is operative;

BCCINIT: for receiving a signal BCCINIT indicating the initialization phase of the best capacitor choice procedure is operative;

BCC*: for receiving a signal BCC* indicating the best capacitor choice procedure is not operative;

a, b: for receiving signals a, b indicating phase a or phase b of the analog signal waveform generation step is operative;

N1: for receiving the switching on order signals of switches K12 and K13;

P1: for receiving the switching on order signals of switches K11 and K14;

N2: for receiving the switching on order signals of switches K22 and K23;

P2: for receiving the switching on signals of switches K21 and K24;

N3: for receiving the switching on signals of switches K32 and K33;

P3: for receiving the switching on signals of switches K31 and K34;

k8 and k'6: for receiving the switching on and switching off order signals of switch k8 in checking mode and for inhibiting switching on or switch K'6.

The supply terminals of circuit SCF are:

BCCREF1 and BCCREF2: reference voltages for the best capacitor choice procedure;

DACREF: reference voltage for the steps generating an analog signal;

VCM: reference common-mode voltage.

The phase a and phase b control signals are generated by a phase generator GENPHA which operates in connection with a high frequency clock H (for example 15 MHz), but only outside the best capacitor choice procedure. This generator can be triggered by a signal CONV indicating the start of the digital/analog conversion.

Order signals k8, K'6, N1, P1, N2, P2, N3, P3 are generated by a digital/analog conversion sequencer DACSEQ. However, those signals are synchronized by the signals created by the phase generator GENPHA in order that switches K11-K34 and also K6, K'6, K8 are switched off and switched on in synchronization with phases a and b according to the process explained in reference with FIGS. 1-3. An assembly of AND gates symbolizes this synchronization between the outputs of sequencer DACREF and the inputs of the control circuit SCF.

Sequencer DACREF carries out the series of switching on and switching off phases of switches as explained in reference with FIGS. 1-3, under the control of the signals it receives, which are:

BCC: signal indicating the best capacitor choice procedure is operative;

H: a 15-MHz clock, for example;

a0, a1, a2: bits of the digital control word indicating the increment value and sign for the analog differential voltage that are to be supplied between outputs S and S'; those signals act in particular on the signal selection among signals N1, N2, N3, P1, P2, P3 that will be activated during the increment formation.

S1, S2, S3: binary signals, two of which are at a low level (for example) and one at a high level; the signal at a high level designates the input capacitor, C1, C2 or C3 that has to be activated for forming an increment when the increment amplitude to be produced is V.

Sequencer DACSEQ further permits to control switching on and switching off of switches K11–K34 during the best capacitor choice procedure; indeed, switches K11–K34 have to be controlled for achieving the steps summarized in FIGS. 4 and 5 and the outputs of sequencer DACSEQ can be used for carrying out those controls.

Sequencer DACSEQ receives for this purpose three additional order signals:

H': lower frequency clock, for example 2 MHz, because the comparison steps of capacitors do not need to be carried out at as high a frequency as digital/analog conversion.

CH, CH': two bits indicating which comparison is to be carried out: C1 with C2, C2 with C3 or C3 with C1.

Those additional order signals re generated by another sequencer BCCSEQ which sets the necessary sequences for carrying out the best capacitor choice procedure.

The second sequencer BCCSEQ supplies, in addition to signals CH and CH' determining selections of comparisons to be carried out, signal BCCINIT indicating an initialization phase of a comparison step is being carried out, and signal BCCCOMP indicating the comparison phase itself. The sequencer produce a first pair of signals CH, CH' and successive signals BCCINIT and BCCCOMP, for comparing a first pair of capacitors, then a second pair CH, CH' for comparing two other capacitors and the corresponding signals BCCINIT and BCCCOMP. Once the three input capacitors have been compared by pair, sequencer BCCSEQ generates a stop signal for the best capacitor choice procedure (signal STOPBCC).

Sequencer circuit BCCSEQ is driven by the clock signal H', signals BCCINIT and BCCCOMP being synchronized by this clock (2 MHz), and by a signal BCC determining the time duration of the best capacitor choice procedure.

Sequencer BCCSEQ lastly supplies a shifting signal CSR for a shift register REG wherein are stored the data on the input capacitor relative values.

The shift register REG receives on a series input the output S' (for example) from the differential amplifier. The state of output S is taken into account at the time a shifting pulse is applied by signal CSR, that is, at the end of each phase BCCCOMP.

The register has three parallel outputs applied to the outputs of a 3-input/3-output decoder DEC.

According to the content of register REG at the end of procedure BCC (best capacitor choice procedure), the decoder supplies a specific level on one of its three outputs S1, S2, S3 and this level designates the input capacitor C1, C2 or C3 that will have to be used subsequently during the formation of an analog signal increment +V or −V.

This designation will remain valid as long as a new procedure BCC is not to be carried out. In some cases, one procedure BCC only will be sufficient for the circuit lifetime, at the time it is first operated. In other cases, a periodical checking can be devised (at each plugging of the circuit for example).

The following decoding table can be devised for the decoder DEC; assuming D1, D2, D3 are the bits stored in register REG; D1 representing a bit resulting from comparison of C1 with C2, with D1=1 if C2 is higher than C1 and D1=0 in the opposite case; D2=1 if C3 is higher than C2 and D3=1 if C3 is higher than C1:

| D1 | D2 | D3 |       | S1 | S2 | S3 |                |
|----|----|----|-------|----|----|----|----------------|
| 0  | 0  | 0  |       | 0  | 1  | 0  | selection of C2 |
| 0  | 0  | 1  | error | 1  | 0  | 0  | selection of C1 |
| 0  | 1  | 0  |       | 0  | 0  | 1  | selection of C3 |
| 0  | 1  | 1  |       | 1  | 0  | 0  | selection of C1 |
| 1  | 0  | 0  |       | 1  | 0  | 0  | selection of C1 |
| 1  | 0  | 1  |       | 0  | 0  | 1  | selection of C3 |
| 1  | 1  | 0  | error | 1  | 0  | 0  | selection of C1 |
| 1  | 1  | 1  |       | 0  | 1  | 0  | selection of C2 |

The error cases are cases of incompatibility of the comparison results, due to the very slight difference in capacitors; any capacitor is then selected, for example C1.

A waveform generator operating by applying a sequence of digital words having a very high frequency and a very satisfactory linearity despite the fact it operates by forming increments liable to have several different values has been described in the above.

The invention can be used in cases where the ratio between the values of the increments is different from 3 or more than two increment values are used. For example, if there are three possible increment amplitudes V, 3V and 5V, a classification procedure of five normally identical capacitors is carried out for determining the median capacitor among the capacitors classified according to ascending order, for subsequently selecting this median capacitor if an increment V has to be produced, for selecting this median capacitor and its two adjacent ones if an increment 3 V has to be produced, the five capacitors being set in parallel when increment 5 V is to be produced.

I claim:

1. A waveform generator designed to supply an analog signal from a sequence of digital control words, each word representing an increment of the analog signal to be produced, the generator comprising:
   a switched-capacitor circuit including a differential amplifier having at least one input and one output,
   an integration capacitor coupled between the output and the input,
   a feedback switched-capacitor coupled between the output and the input,
   several input switched-capacitors with the same nominal capacitance value and connected to be selectively switched between a reference voltage and the input, either individually or in parallel as a function of the digital control word applied,
   means for determining which one of the input capacitors has the closest actual capacitance value to the average capacitance value of the input capacitors, and
   means for selecting the determined one input capacitor for use during a subsequent formation sequence of an analog signal when the applied control word denotes switching of a single input capacitor between the reference voltage and the amplifier input.

2. A generator according to claim 1 wherein said means for determining comprise means for applying a common reference voltage to charge two input capacitors, means for selectively connecting the charged input capacitors in parallel to the amplifier input so that their charges are counterbalanced, the amplifier being set in open loop and a state of the amplifier output depending upon the sign of the difference between the charges of the two capacitors, means for storing an indication corresponding to the amplifier output state, and sequencer means for controlling said determining means to sequentially charge each possible pairing of the input capacitors and connect each charged pairing of the input capacitors to the amplifier.

3. A generator according to claim 2 comprising a register for storing the data on the amplifier output state and a decoder at the output of the register, said decoder classifying the input capacitors in a sequence of values and determining which capacitor corresponds to the median of the sequence.

4. A generator according to claim 2 wherein the input capacitors are selectively connected with their connections crossed at the amplifier input through other capacitors wherein offset voltages of the differential amplifier have been previously charged.

5. A generator according to claim 1 wherein said amplifier is a symmetric differential amplifier with two differential outputs and said switched-capacitor circuit is symmetrical with respect to the differential amplifier.

* * * * *